(12) United States Patent
Dussert-Vidalet et al.

(10) Patent No.: US 9,515,293 B2
(45) Date of Patent: Dec. 6, 2016

(54) OLED ENCAPSULATED IN A FULL-WAFER ADHESIVE HAVING A PERFORATED COVER

(75) Inventors: Bruno Dussert-Vidalet, La Garde (FR); Mohamed Khalifa, La Valette du Var (FR); Claire Vacher, La Valette du Var (FR)

(73) Assignee: Astron Flamm Safety Sarl, Toulon (FR)

( * ) Notice: Subject to any disclaimer, the term of this patent is extended or adjusted under 35 U.S.C. 154(b) by 271 days.

(21) Appl. No.: 14/127,005

(22) PCT Filed: Jun. 15, 2012

(86) PCT No.: PCT/EP2012/061460
§ 371 (c)(1),
(2), (4) Date: Apr. 14, 2014

(87) PCT Pub. No.: WO2012/172059
PCT Pub. Date: Dec. 20, 2012

(65) Prior Publication Data
US 2014/0217377 A1    Aug. 7, 2014

(30) Foreign Application Priority Data

Jun. 17, 2011 (FR) ...................................... 11 55353

(51) Int. Cl.
*H01L 21/00* (2006.01)
*H01L 51/56* (2006.01)
*H01L 51/52* (2006.01)

(52) U.S. Cl.
CPC ........... *H01L 51/56* (2013.01); *H01L 51/5203* (2013.01); *H01L 51/524* (2013.01); *H01L 51/5246* (2013.01); *H01L 2224/48463* (2013.01); *H01L 2224/73265* (2013.01); *H01L 2251/5361* (2013.01); *H01L 2924/12044* (2013.01)

(58) Field of Classification Search
CPC ..... H01L 51/56; H01L 51/524; H01L 51/5246
See application file for complete search history.

(56) References Cited

U.S. PATENT DOCUMENTS

2005/0242721 A1*  11/2005  Foust ................. H01L 51/0097
                                                           313/511
2010/0294526 A1   11/2010  Farquhar et al.

FOREIGN PATENT DOCUMENTS

EP          1120838        8/2001
JP          2002299047     10/2002
WO      WO 2008012460      1/2008

OTHER PUBLICATIONS

PCT/ISA/237 Written Opinion issued on PCT/EP2012/061460 pp. 7.
PCT/ISA/210 Search Report issued on PCT/EP2012/061460 pp. 4.

* cited by examiner

*Primary Examiner* — Laura Menz
(74) *Attorney, Agent, or Firm* — The Farrell Law Firm, P.C.

(57) ABSTRACT

The invention relates to an organic light-emitting diode (OLED) comprising a stack comprising, in sequence and in the following order, a substrate (2), a first electrode (3), an organic layer (4), and a second electrode (5), characterized in that it comprises a layer of adhesive (6) and a cover (7) fixed onto said stack using said layer of adhesive (6), and the cover (7) comprises at least one through-opening (8), wherein electrical access to an electrode (3, 5) is possible through said opening (8).
The present invention can be more specifically used in electronic devices having screens and lighting.

19 Claims, 3 Drawing Sheets

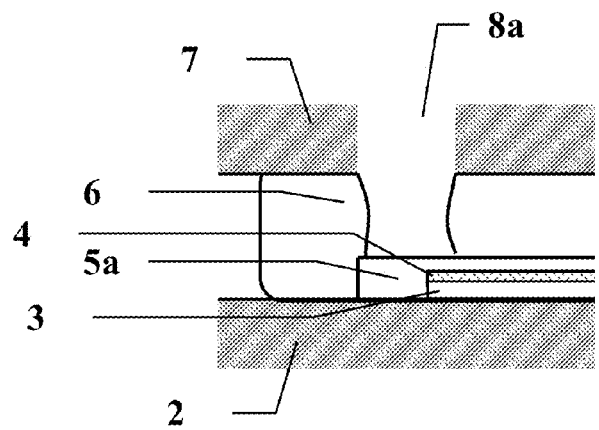
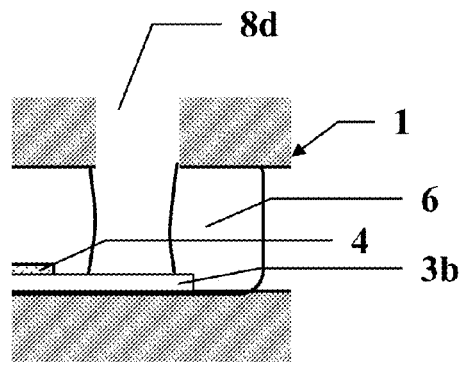
FIG. 1     FIG. 2
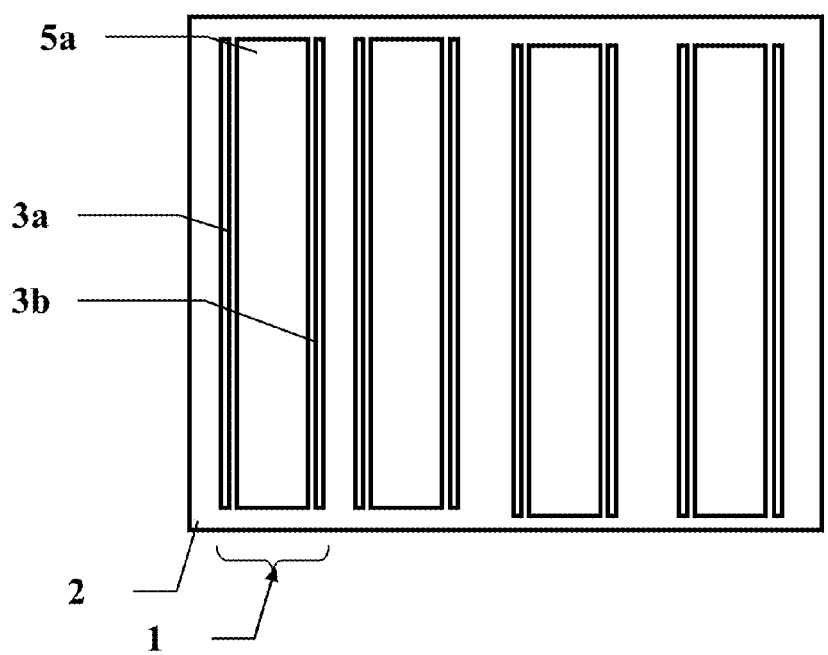
FIG. 3

OLED ENCAPSULATED IN A FULL-WAFER ADHESIVE HAVING A PERFORATED COVER

PRIORITY

This application is a U.S. National Phase application of International Application No. PCT/EP2012/061460 filed Jun. 15, 2012, claiming priority to Application No. 1155353 filed with the French Intellectual Property Office on Jun. 17, 2011, the content of each of which is incorporated herein by reference.

The technical field of the invention is that of organic light-emitting diodes, the OLEDs.

The invention will particularly find its application in the field of lighting using large sized OLEDs.

In such an organic light-emitting diode, an injection of charge carrier from the electrodes, electrons from a cathode or positive holes from an anode, is performed under the effect of applying a voltage between these electrodes. The charge carriers are matched in an emission layer comprising organic emitters, also called an organic layer, to form excitons. A radiative recombination allows the emission of light.

If the organic layer enables a light emission, it however has a poor resistance to contact with water or oxygen. A contact of the organic layer with water or oxygen produces oxidation and results in a loss of the chemical properties and light-emitting properties. The service life of an OLED is thus directly related to the quality of the encapsulation required for the protection thereof from a contact with water and oxygen.

The maximum permissible rate of penetration of water, respectively oxygen, in an OLED is $10^{-6}$g/(m$^2$.day.atmosphere), respectively $10^{-4}$g/(m$^2$.day.atmosphere).

To achieve these rates, it is currently known to make a sealing encapsulation of an OLED, by protecting said OLED with a hollow cover bonded with an adhesive peripheral seal on a stack of layers comprising the organic layer, on the side opposite the substrate. The volume between the cover and the OLED comprises an inert gas. However, to operate the OLED it is necessary to access the electrodes to provide for the electrical contacts.

For this purpose, it is known to produce a short cover through which the electrical connectors remain accessible. This technique is very expensive and delicate.

Document U.S. 2005/0242721 describes an OLED provided with a cover and a passage of connectors through the cover. However, this construction does nothing to optimize the formation of a seal.

A way to access the electrodes of a DELO is searched while performing an encapsulation providing an efficient protection of the organic layer against a contact with water and/or oxygen.

An object of the present invention is an organic light-emitting diode, an OLED, comprising a stack comprising in sequence and in the following order, a substrate, a first electrode, such as an anode, an organic layer, a second electrode, such as a cathode, a layer of an adhesive fixed to said stacking means using said layer of adhesive, wherein the cover comprises at least one through-opening enabling electrical access to an electrode through said opening.

In an advantageous aspect, the nature of the material of the cover and the dimensions of the opening are so selected as to produce a surprising effect by which the layer of adhesive does not spread, at least not entirely, opposite the opening. Thus it still offers optimized access for an electrical connection of at least one electrode. Such a result is excluded in the prior art.

According to another characteristic of the invention, the cover is made of glass or metal.

According to another characteristic of the invention, the cover is planar.

According to another characteristic of the invention, the cover is transparent.

According to another characteristic of the invention, the cover comprises at least a first opening enabling electrical access to an electrode and at least a second opening enabling access to a second electrode.

According to another characteristic of the invention, the first electrode comprises a projecting portion jutting laterally out from the organic layer.

According to another characteristic of the invention, at least one opening is formed opposite the projecting part of the first electrode.

According to another characteristic of the invention, at least one opening is formed opposite the edge of the first electrode.

According to another characteristic of the invention, the second electrode comprises a projecting portion jutting laterally out from the organic layer.

According to another characteristic of the invention, at least one opening is provided opposite the portion jutting out from the second electrode.

According to another characteristic of the invention at least one second opening is provided opposite the edge of the second electrode.

According to another characteristic of the invention, the smallest dimension of an opening (in section in a direction transverse to the thickness of the stack of layers) is at least 0.4 mm, more specifically, an opening has a width of at least 0.4 mm.

According to another characteristic of the invention, at least one opening at least partially, preferably only partially, comprises glue.

According to another characteristic of the invention, an opening is spaced by at least 4 mm from another opening.

According to another characteristic of the invention, the width of an opening is at least 1000 times greater than the thickness of the stack comprising the first electrode, the organic layer, the second electrode, and the layer of adhesive.

According to another characteristic of the invention, an opening is spaced by at least 2 mm from the organic layer.

According to another characteristic of the invention, the first electrode and the second electrode respectively comprise electrical contact means for enabling an electrical connection.

According to another characteristic of the invention, the at least one opening is provided opposite the electrical contact means.

According to another characteristic of the invention, the layer of adhesive is continuous over the entire surface of the OLED except for the openings.

According to another characteristic of the invention, the layer of adhesive is interrupted opposite each of the openings.

According to another characteristic of the invention, the cover covers the entire surface of the OLED.

According to another characteristic of the invention, the OLED comprises a polyurethane coating arranged over the cover According to another characteristic of the invention, the smallest dimension of the OLED is at least one centimeter, preferably above 5 centimeters.

The invention further relates to a method for manufacturing an organic light-emitting diode, an OLED, comprising a stack comprising in sequence and in the following order, a substrate, a first electrode, such as an anode, an organic layer, a second electrode, such as a cathode, a layer of adhesive and a cover fixed to said stack by means of said layer of adhesive. The cover comprises at least one through-opening enabling access to an electrical electrode through said opening, comprising the steps of: forming at least one through-opening in the cover, enabling electrical access to an electrode through said opening, depositing a layer of adhesive onto the cover, positioning the cover above the second electrode of said stack, pressing the cover onto said stack so configured that the movement of the adhesive between the cover and the second electrode at least partially protects the access to at least one electrode through the opening.

According to another characteristic of the invention, the layer of adhesive is obtained by deposition onto an inner face of the cover.

According to another characteristic of the invention, at least one opening is formed opposite the electrical contact means with an electrode.

According to another characteristic of the invention, the step of pressing is performed by applying a minimum pressure of 100 mbars onto the assembly, so as to obtain a layer of adhesive less than 20 micrometers thick.

According to another characteristic of the invention, the method comprises a step of depositing a polymer coating onto the cover The invention also relates to a lighting device comprising at least one OLED as described above.

The invention also relates to a lamp comprising at least one OLED as described above.

Other characteristics, details and advantages of the invention will become apparent from the detailed description given below for information in connection with the drawings in which:

FIG. 1 shows a partial sectional view through the thickness of an OLED at an opening 8a.

FIG. 2 shows a partial cross section through the thickness of an OLED at an opening 8d.

FIG. 3 shows a top view of a plate of OLEDs,

Figure 4:
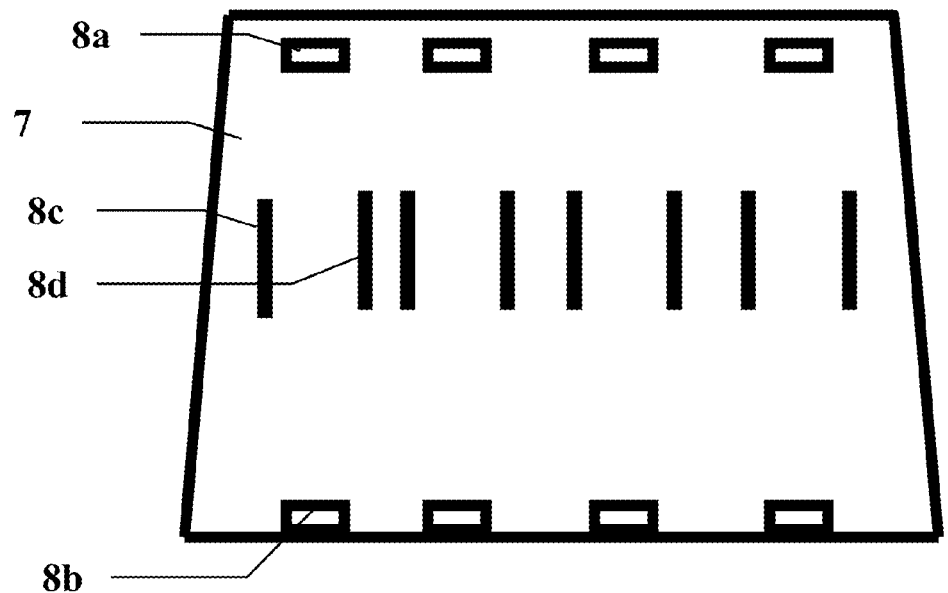
FIG. 4 shows a top view of a cover according to the invention suitable for the OLEDs in FIG. 3.

The OLED according to the invention is intended to be used in the field of domestic, industrial or urban lighting, for example in lamps.

The OLED has dimensions greater than one centimetre, preferably of the order of several tens of centimetres.

FIG. 1 shows a partial sectional view in thickness of an organic light-emitting diode, an OLED, at an opening 8a. An OLED 1 consists of an ordered succession of layers forming a stack. Said stack comprises in sequence and in the following order, from bottom to top in FIG. 1: a substrate 2, a first electrode 3, an organic layer 4, a second electrode 5. According to a preferred embodiment, the first electrode 3 is an anode 3 whereas the second electrode 5 is a cathode 5. A layer of adhesive 6 and a cover 7 fixed on said stack by said layer of adhesive 6 are additionally provided on this stack. Preferably, the first electrode 3 extends beyond the stack. The electrode 3 juts laterally out from the organic layer 4. This projecting portion enables electrical access through the upper part of the DELO, in particular through the cover. Preferably, the second electrode 5 at least partially covers the organic layer 4, the electrode 5 covers the totality of the surface of the organic layer 4 without being in contact with the electrode 3, for lack of creating a short circuit. Preferably, the second electrode 5 extends beyond the organic layer 4 as shown in FIG. 1. The second electrode 5 juts laterally out from the stack. The projecting portion of the second electrode 5 and the projecting portion of the first electrode 3 are not superimposed and are not in contact at the risk of creating a short circuit.

The substrate 2 is typically a flat plate made of transparent material, e.g. glass. The two electrodes 3, 5, the anode 3 and the cathode 5, are electrically conductive layers typically made of metallic materials. As for the anode 3, it can be made of indium tin oxide (ITO). This material has interesting properties of electrical conductivity and optical transparency in the manufacturing of the OLED. The organic layer 4 comprises one or more sub-layers contributing to the matching of the charge carriers within an emission sub-layer in order to achieve a radiative recombination which enables the emission of light, the object of the OLED.

Said OLED is encapsulated on one side by the substrate 2, which forms a continuous sheet forming a closed protection. On the other side, the encapsulation is achieved by a cover 7 and a layer of adhesive 6 which makes it possible to fix said cover onto the stack 7. The cover 7 is for example made of glass, plastic or metal. The cover 7 is transparent or opaque. The cover 7 is preferably planar.

The cover 7 advantageously has at least the same size as the OLED to be encapsulated.

According to the invention, the OLED is preferably rigid.

For the OLEDs to be operative, the anode 3 and the cathode 5 must be electrically connected to a power supply to provide said charge carriers. This electrical contact is typically provided by an electrical conductor, such as a wire, from the outside of the cover 7 and connected to the electrode 3, 5. This requires a contact to be provided by a continuous electrical conductor, from the outside to the electrode 3, 5. This requires going through the cover 7.

For this purpose, according to the invention, the cover 7 comprises at least one through-opening 8. As this opening 8 goes through the entire thickness of the cover 7, it enables electrical access to an electrode 3, 5. The electrical conductor can thus go through the cover 7 through said opening 8.

The OLED according to the invention is particularly surprising because the formation of a rigid cover, made of glass or metal having openings 8 would not have been considered by the specialists in the art for whom this assembly would be too fragile. Now, it is obvious that the OLED according to the invention is particularly resistant to breakage. Preferably, the minimum thickness of the cover 7 is 700 microns and it thus remains rigid after assembly with the layer of adhesive. Advantageously, the substrate 2 also has a minimum thickness of 700 micrometers so as to have satisfactory stiffness and resistance to breakage.

The openings 8 can have various shapes, like a circle or a parallelepiped.

Preferably, the electrodes 3.5 comprise electrical contact means 3a, 3b, 5a. These electrical contact means 3a, 3b, 5a are formed at the electrode 3, 5 and enable the electrical connection. The contact means 3a, 3b are preferably formed at the projecting portion of the electrode 3 and the contact means 5a are preferably formed at the projecting portion of the electrode 5.

Advantageously, the opening 8 is formed opposite the electrical contact means 3a, 3b, 5a of an electrode 3, 5. This however gives significant freedom to locate the openings 8.

An opening 8 is obtained by any fabrication means. Preferably, laser machining is used to form the openings 8 in the cover 7. The cover may be provided with openings 8 prior to assembling the OLED.

Still advantageously, at least one opening 8 gives access to the anode 3, and at least one opening 8 gives access to the cathode 5.

According to the invention, access to both electrodes 3 and 5 is on the same side of the OLED and advantageously through the cover 7. This arrangement facilitates the fabrication of the OLED.

As shown in FIGS. 1 and 2 and according to a preferred embodiment, the at least one opening 8a is so arranged as to face the electrical contact means 5a of the second electrode 5, preferably opposite the projecting portion of the second electrode 5. More specifically, the opening is opposite an edge of said electrode 5. This arrangement facilitates the encapsulation by glue and the draining of the adhesive in excess in the opening 8a without clogging.

Similarly, the opening 8d is so arranged as to face the electrode 3, preferentially the projecting portion of said electrode 3. More specifically, the opening faces the edge of the electrode 3.

It should be understood that the same shall apply to openings 8b and 8c.

FIG. 3 is a top view of a plate comprising a substrate 2 carrying four pixels of an OLED 1. For each pixel, there is an anode 3 preferentially accessible through two contact means 3a, 3b. There is also a cathode 5 accessible through contact means 5a.

The contact means 3a, 3b of the anode 3 and the cathode 5 5a advantageously have large surfaces. The contact means 3a, 3b, 5a are preferably made by deposition of a metal layer by thermal evaporation of 1 micron maximum.

FIG. 4 is a top view of a cover 7 adapted to the plate of OLEDs of FIG. 2. Said cover 7 comprises openings 8, distributed as two openings 8c, 8d, which provide access to two anode contact means 3a, 3b and two openings 8a, 8b which provide access to the cathode 5 contact means, in two separate locations.

Figure 5:
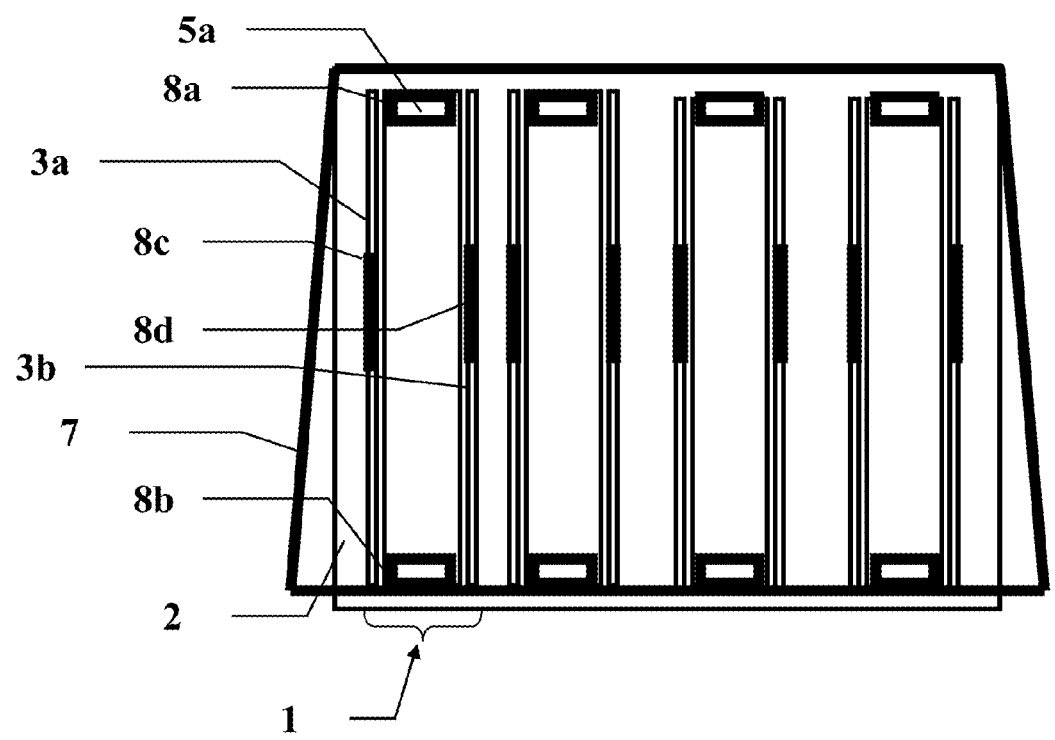
FIG. 5 shows a top view of the assembly of said cover on said plate of OLEDs.

FIG. 5 illustrates the cover 7 of FIG. 3, superimposed in an assembly position, with the plate of OLEDs of FIG. 2. This superimposition shows that the openings 8a-8d are superimposed on the contacts 3a, 3b, 5a.

According to a particularly advantageous embodiment, the cover 7 is planar. This greatly simplifies the implementation of the cover 7 as well as that of the OLED 1. The layer of adhesive 6 makes it possible to advantageously absorb any difference in the level of layers whereon the cover 7 is glued. This provides a good encapsulation at the best cost.

According to an advantageous embodiment, the cover 7 is transparent. This transparency characteristic advantageously enables the light generated in the organic layer to be extracted to the outside in accordance with the function of the OLED.

According to an advantageous characteristic, the cover 7 covers the entire surface of the OLED 1. The cover 7 thus reinforces, in collaboration with the substrate 2, the structure of the plate, and gives, in addition to the encapsulation, a good mechanical resistance to the plate of OLEDs.

More particularly when diamond-cutting the pixels, the cover 7/adhesive 6/substrate 2 assembly is mechanically resistant and uniform, which facilitates secure cutting and reduces the risk of breakage.

In order not to excessively weaken the cover 7, an opening 8 is preferably formed at a distance of at least 4 mm from any other proximate opening 8. This distance is measured in the plane of the cover 7 of the OLED 1.

An opening 8 is preferably provided on the cover 7 at a sufficient distance from the organic layer 4 to prevent, or at least greatly reduce, any ingress of water and/or oxygen from the opening 8 to the organic layer 4. A distance of at least 2 mm is sufficient. This distance is measured in the plane of the cover 7 of the OLED 1. The greater the distance between the outside and the organic layer 4, the longer the diffusion of water molecules and oxygen to the organic layer 4.

The size of an opening 8 is so configured as to allow only the passage of an electrical conductor while ensuring tightness of the OLED. Said size is advantageously reduced in order to limit the risk of creating an inlet for water and/or oxygen. However, thanks to the invention, the openings may be significant because the adhesive 6 forms a satisfactory barrier to the introduction of water and oxygen. Preferably, an opening 8 has a minimum dimension of 0.4 mm, more specifically a width of at least 0.4 mm, for example for a circle, a diameter of 0.4 mm. The smaller dimension of the opening 8 is at least 0.4 mm. For example, an opening 8a, 8d has a length of 15 mm and a width of 3 mm.

As shown in FIGS. 3-5, the electrical contact means 3a, 3b, 5a with an electrode is large compared to the size of an opening 8 necessary for the passage of an electrical conductor. This characteristic advantageously gives a great freedom to position the openings 8, according to the requirements and the constraints imparted for integrating the OLEDs.

Figure 6:
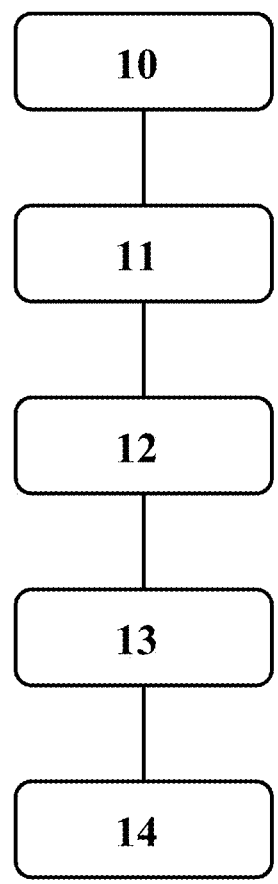
FIG. 6 shows a flowchart of a method for manufacturing an OLED.

The invention further relates to a method for manufacturing a DELO. Such a method comprises the following ordered sequence of steps. Such a process is illustrated by the diagram in FIG. 6.

Advantageously, a first step consists in making a stack 10 comprising successively and in order: a substrate 2, a first electrode 3 such as an anode, an organic layer 4, a second electrode 5 such as a cathode. This can be achieved by any method known in the prior art, like a successive deposition of layers by thermal evaporation, and is not explained in details here.

One or more openings 8 is/are formed in parallel, during a step of forming 11 in a cover 7 adapted to said stack. Each opening 8 is so arranged as to enable electrical access to an electrode 3, 5.

It is important to note that, unlike the prior art, where an opening 8 is formed in a cover 7 after bonding, the opening(s) 8 of the invention is/are provided in the cover 7, before bonding.

When the stack is completed and the cover 7 is perforated, the layer of adhesive 6 can be deposited 12. Said layer is obtained by surface application of glue and can be performed using any known means. Thus, the adhesive can be deposited for example by spraying, roll coating, spin coating, using a brush, etc. The adhesive is typically an epoxy or acrylate adhesive and has a viscosity between 10 mPa·s and 10,000 mPa·s.

The adhesive 12 may be deposited either on the stack or on the inner face, facing the stack, of the cover 7. However, the layer of adhesive is preferably deposited on the already perforated cover 7, specifically on a face intended to be opposite the stack, specifically opposite the second electrode 5, referred to as the inner face of the cover 7. Opposite, or over the second electrode, means that the layer of adhesive and/or the cover are arranged on the free side of the stack opposite the substrate 2. The layer of adhesive covers the second electrode 5 but also the first electrode 3 in the embodiment with a projecting part. As a matter of fact, the fluidity of the adhesive is such, when considering the large size of the openings 8, that the adhesive deposited or sprayed, flows through the openings 8. No adhesive is thus deposited on the cover 7 opposite the openings 8 during assembling operations. The layer of adhesive 6 is thus automatically interrupted opposite each opening 8. This is achieved without any restriction, only because the openings 8 are made before depositing the adhesive.

The invention advantageously allows any form of OLED since the openings 8 are not restrictive. In addition, better production performances are achieved since voltage drops are limited, heat distribution is optimized, light uniformity is improved. The adhesive is selected from adhesives for full plate encapsulation for example epoxy or acrylate adhesives. The adhesive 6 is advantageously selected to withstand operating temperatures of the OLED which may reach 90° C. This means that the adhesive does not lose its sealing properties.

The required amount of adhesive is determined depending on the viscosity of the adhesive and in accordance with the desired thickness of the layer of adhesive 6, after the step of pressing 14.

When the deposition of the layer of adhesive 6 is completed, the cover 7 can be positioned 13 on the stack, preferably on the second electrode 5.

Then a step of pressing 14 of the assembly is carried out. During the step of pressing 14, the adhesive 6 is crushed. This advantageously results in the crushed adhesive 6 following the edges of the openings 8. Advantageously, the openings 8 are of sufficient size with respect to the contact means 3a, 3b, 5a and to the dimensional properties of the adhesive so that, during the pressing, the adhesive in excess is at least partially drained through the openings 8 without obstructing them. Preferably, the adhesive 6 covers a maximum area of 20% of the opening 8, more preferably less than 10%.

In a preferred embodiment, the smallest dimension of one opening 8, specifically the width thereof is at least 100 times greater than the thickness of the stack comprising only the first electrode 3, the organic layer 4, the second electrode 5. More preferably, the dimensional relation is at least 1,000. For example, such a stack has a thickness of about 300 to 400 nm, whereas an opening 8 has a minimum width of 0.4 mm. The adhesive 6 thus does not spread on the electrical contact means 3a, 3b, 5a with the electrodes 3, 5. The encapsulation obtained is perfect, and at the same time the electrical contact means are saved and do not receive or only partially receive adhesive.

According to a preferred characteristic, the step of pressing 14 is executed by applying a minimum pressure of 100 mbar onto the assembly. When this is combined to a suitable adhesive thickness between 10 μm and 500 μm, a layer of adhesive 6 having a thickness of preferably less than 20 microns is obtained.

According to one possibility, a UV treatment is carried after the step of pressing to cross-link the adhesive 6.

Figure 7:
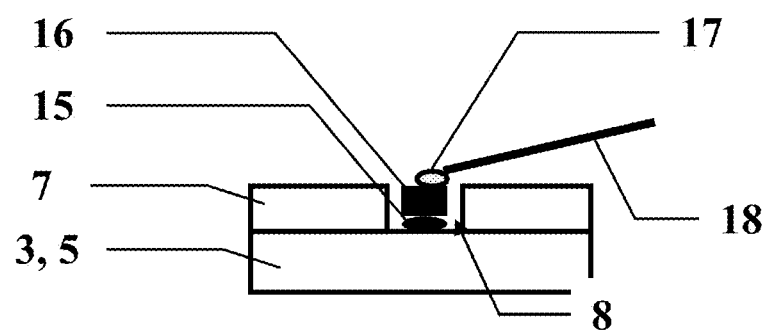
FIG. 7 illustrates an embodiment of an electrical connection.

An embodiment of an electrical contact will now be described in connection with FIG. 7, by means of an opening 8 provided according to the invention. An opening 8 provided according to the invention enables electrical access to the contact means 3a, 3b, 5a, of an electrode 3, 5. Electrically conductive adhesive 15 is deposited into said opening 8. This adhesive 15 makes it possible to secure a chip 16, for example made of copper. A conductive wire 18 can be welded, for example using tin 17, onto this chip 16 the thickness of which is so dimensioned that it is flush with the outer surface of the cover 7.

The opening 8 is advantageously not plugged by the electrical contact. The opening 8 is then only partially blocked by the electrical contact. Preferably according to the invention, the openings 8 giving access to the electrodes 3-5 remain open after positioning the electrical contact.

According to one alternative embodiment of the invention, the OLED 1 comprises a coating made of polymer, preferably polyurethane, positioned over the cover 7 and preferably once the electrical contacts are made.

This polymer coating is advantageously flexible. According to a preferred option, the coating is deposited onto the cover by spraying, rolling, spin coating, using a brush, etc.

The coating improves the resistance of the cover 7 to breaking.

The coating is advantageously so configured as to flatten the surface of the OLED 1 above the cover 7. The coating thus forms a flat layer over the cover 7 including over the openings 8. According to one possibility, the coating fills the openings 8 to flatten the OLED. Alternatively, the coating is so configured as not to enter the openings 8, the coating remains on the surface of the openings 8 substantially at the level of the cover 7.

Advantageously, the thickness of the coating is such that it makes it possible to embed the electrical contacts in particular the conductive wire 18 so as to flatten the surface of the OLED. The coating layer may be transparent or opaque. In the case of a transparent coating, the light emission may be through the coating layer.

Although described in the present preferred embodiments of the invention, it should be understood that the invention is not limited to these embodiments, and that modifications may be brought therein within the scope of the following claims.

REFERENCES

1. DELO
2. Substrate
3. Anode
3a. 3b. Anode electrical contact means
4. Organic layer
5. Cathode
5a. Cathode electrical contact means
6. Adhesive
7. Cover
8. Opening
8a. 8b. Opening for cathode contact
8c. 8d. Opening for anode contact
10. ODEL stack
11. Creation of an opening in the cover
12. Deposition of adhesive
13. Positioning of the cover
14. Pressing
15. Conductive adhesive
16. Pad
17. Tin
18. Conductive wire

The invention claimed is:

1. A method for manufacturing an organic light-emitting diode (OLED) comprising a stack comprising in sequence and in the following order, a substrate, a first electrode, an organic layer, a second electrode, a layer of adhesive and a cover fixed to said stack by means of said layer of adhesive above the second electrode, the cover comprises at least one first through-opening enabling electrical access to the second electrode through said at least one first through-opening, wherein the method comprises the following successive steps:
   forming in the cover the at the least one first through-opening enabling electrical access to the second electrode through said opening, the at least one first through-opening extending between an inner face and an outer face of the cover,
   depositing the layer of adhesive onto the inner face of the cover,
   positioning the cover above the second electrode of said stack with the layer of adhesive contacting an outer face of the second electrode,
   pressing the cover on said stack to generate a movement of the layer of adhesive between the inner face of the cover and an outer face of the second electrode, the pressing configured to at least partially maintain an electrical access to the outer face of the second electrode through the at least one first through-opening.

2. The method according to claim 1, wherein depositing the layer of adhesive is performed by a deposition on the inner face of the cover.

3. The method according to claim 1, further comprising forming the first electrode and the second electrode with respective electrical contact means configured to enable an electrical connection.

4. The method according to claim 1, wherein the step of pressing is performed by applying a minimum pressure of 100 mbar onto the outer face of the cover so that the layer of adhesive is less than 20 micrometers thick.

5. The method according to claim 1, further comprising a step of depositing a polymer coating onto the outer face of the cover and onto the at least one first through-opening.

6. The method according to claim 3, wherein the at least one first through-opening faces the electrical contact means of the second electrode.

7. The method according to claim 1, further comprising forming the first electrode with a projecting portion jutting laterally out from the organic layer.

8. The method according to claim 1, wherein the cover covers the entire surface of the OLED.

9. The method according to claim 7, further comprising forming at least one second through-opening enabling electrical access to the first electrode.

10. The method according to claim 1, wherein at the step of forming the at least one first through-opening in the cover, the opening is formed such that an opening of the at least one first through-opening is spaced by at least 4 mm from another opening of the at least one first through-opening.

11. The method according to claim 1, wherein the step of forming the at least one first through-opening in the cover comprises forming a first through-opening facing a border surface of the second electrode that is jutting laterally out from the organic layer.

12. The method according to claim 9, wherein forming the at least one second through-opening comprises forming a second through-opening that faces the projecting portion of the first electrode.

13. The method according to claim 1, wherein at least one first through-opening in the cover is executed such that each opening of the at least one first through-opening has a width of at least 0.4 mm.

14. The method according to claim 1, wherein at least one first through-opening in the cover is formed such that the width of each opening of at least one through-opening is at least 1000 times greater than a thickness of the stack.

15. The method according to claim 1, wherein at least one first through-opening in the cover is formed such that a wall surface of at least one opening of the at least one first through-opening is at least partially covered by the layer of adhesive.

16. The method according to claim 1, wherein each opening of the at least one first through-opening is spaced by at least 2 mm from the organic layer.

17. The method according to claim 1, wherein at the step of depositing the layer of adhesive onto the cover, the layer of adhesive is deposited in a continuous manner on the entire surface of the OLED with the exception of the openings.

18. The method according to claim 5, wherein the polymer coating is a polyurethane coating.

19. A method for manufacturing an organic light-emitting diode (OLED) comprising a stack comprising in sequence and in the following order, a substrate, a first electrode, an organic layer, a second electrode, a layer of adhesive and a cover fixed to said stack by means of said layer of adhesive above the second electrode, the method comprising forming the first electrode with a projecting portion jutting laterally out from the organic layer, the cover comprising at least one first through-opening enabling electrical access to the second electrode through said at least one first through-opening, the cover comprising at least one second through-opening enabling electrical access to the first electrode through said at least one second through-opening, wherein the method comprises the following successive steps:
   forming in the cover the at least one first through-opening enabling electrical access to the second electrode through said opening, the at least one first through-opening extending between an inner face and an outer face of the cover, and forming in the cover the at least one second through-opening enabling electrical access to the first electrode through said opening, the at least one second through-opening extending between an inner face and an outer face of the cover, wherein forming the at least one second through-opening comprises forming a second through-opening that faces the projecting portion of the first electrode,
   depositing a layer of adhesive onto the inner face of the cover,
   positioning the cover above the second electrode with the layer of adhesive contacting an outer face of the second electrode, and
   pressing the cover on said stack so configured to generate a movement of the adhesive between the inner face of the cover and the outer face of the second electrode, the pressing configured to at least partially maintain an access to the second electrode through the at least one first through-opening and to the first electrode through the at least one second through-opening.

* * * * *